(12) United States Patent
Kular et al.

(10) Patent No.: US 8,321,619 B2
(45) Date of Patent: Nov. 27, 2012

(54) COMBINATION POWER MEMORY DEVICE

(75) Inventors: Andrew C. Kular, Ottawa (CA);
Zuohang Zhu, Ottawa (CA)

(73) Assignee: Ecosol Solar Technologies, Inc. (CA)

( * ) Notice: Subject to any disclaimer, the term of this patent is extended or adjusted under 35 U.S.C. 154(b) by 0 days.

(21) Appl. No.: 12/447,399

(22) PCT Filed: Oct. 29, 2007

(86) PCT No.: PCT/US2007/082861
§ 371 (c)(1),
(2), (4) Date: Oct. 11, 2009

(87) PCT Pub. No.: WO2008/052218
PCT Pub. Date: May 2, 2008

(65) Prior Publication Data
US 2010/0036993 A1    Feb. 11, 2010

Related U.S. Application Data

(60) Provisional application No. 60/863,277, filed on Oct. 27, 2006.

(51) Int. Cl.
*G06F 13/20* (2006.01)
(52) U.S. Cl. .................. 710/313; 710/305; 713/324
(58) Field of Classification Search .................. 710/313, 710/305; 713/300–340; 711/115
See application file for complete search history.

(56) References Cited

U.S. PATENT DOCUMENTS

| | | | |
|---|---|---|---|
| 6,774,604 B2 * | 8/2004 | Matsuda et al. | 320/110 |
| 7,509,444 B2 * | 3/2009 | Chiu et al. | 710/51 |
| 2002/0038432 A1 | 3/2002 | Hsu | |
| 2005/0138218 A1 | 6/2005 | Chen | |
| 2006/0033474 A1 | 2/2006 | Shum | |
| 2006/0095641 A1 | 5/2006 | Pandit | |
| 2006/0227123 A1 | 10/2006 | Bychkov | |
| 2006/0262351 A1 * | 11/2006 | Kim | 358/1.16 |
| 2007/0176912 A1 * | 8/2007 | Beames et al. | 345/204 |
| 2007/0271476 A1 * | 11/2007 | Jang | 713/324 |
| 2008/0098172 A1 * | 4/2008 | Tsang et al. | 711/115 |
| 2010/0320971 A1 * | 12/2010 | Zhu et al. | 320/134 |

FOREIGN PATENT DOCUMENTS

| GB | 2386005 A | 9/2003 |
|---|---|---|
| GB | 2401259 A | 11/2004 |

OTHER PUBLICATIONS

Powerstick—"Portable USB Charger + Memory"; 2 pages, dated 2011.*
European Search Report, Dec. 28, 2011, PCT/US2007/082861, Int'l Filing Date—Oct. 29, 2007.

* cited by examiner

*Primary Examiner* — Brian Misiura
*Assistant Examiner* — Kim Huynh
(74) *Attorney, Agent, or Firm* — Timothy D. Bennett; Emerson Thomson Bennett

(57) ABSTRACT

A portable power and/or memory device is disclosed, which device includes integrated management circuitry enabling on-board management of energy storage, power management, and memory management. In a preferred embodiment, the device of the present invention can store and make available both memory and power, and provides an on-board means for displaying the various memory and/or power parameters associated with the device, using a USB interface to receive power for storage and to communicate between onboard memory and a device to which the portable power and/or memory device is connected.

9 Claims, 1 Drawing Sheet

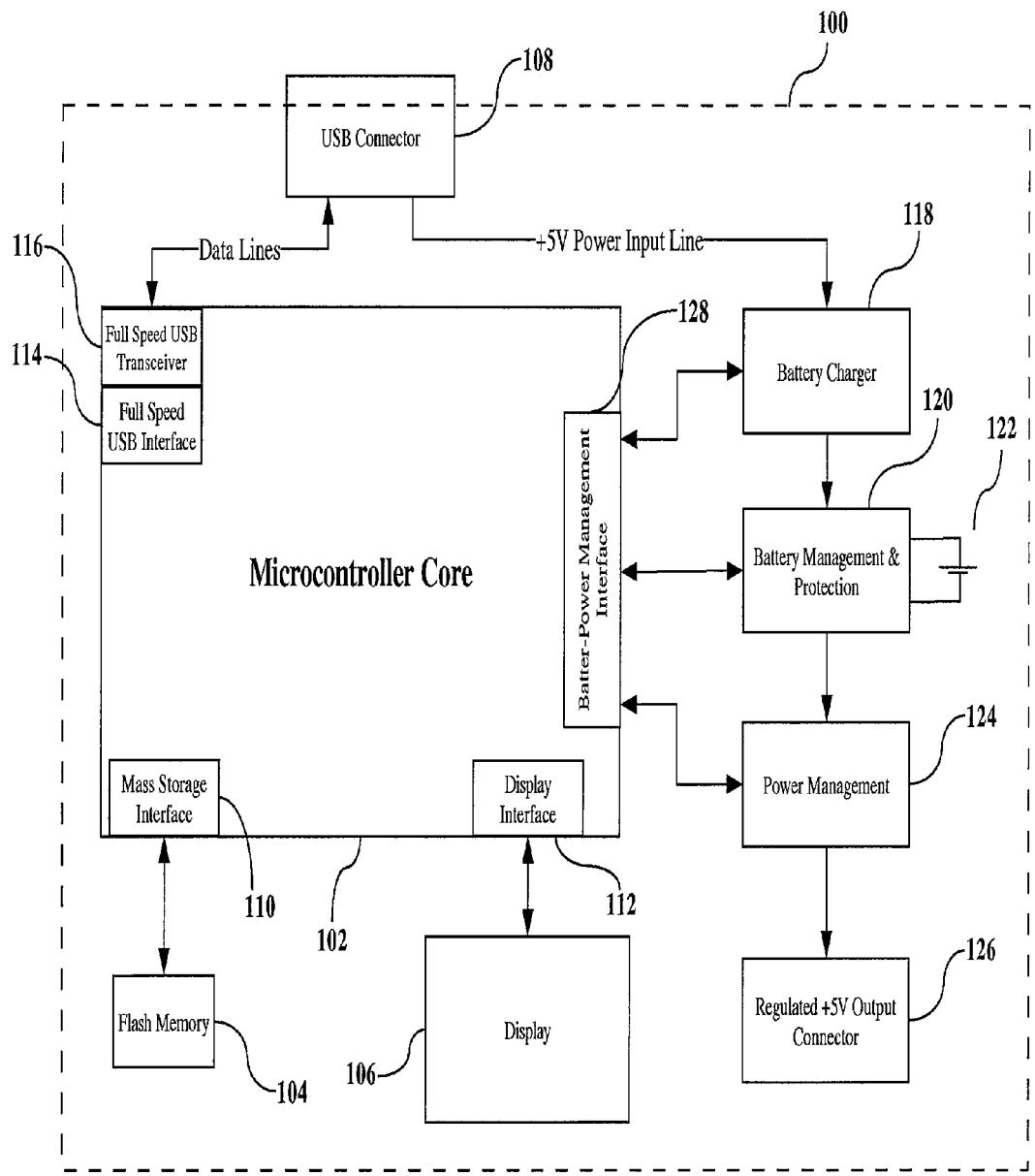

COMBINATION POWER MEMORY DEVICE

CROSS-REFERENCE TO RELATED APPLICATIONS

This application is based on and claims priority to U.S. Provisional Patent Application No. 60/863,277, filed Oct. 27, 2006, the entire contents of which is fully incorporated herein by reference.

BACKGROUND OF THE INVENTION

Field of the Invention

The present invention relates to portable devices and, more particularly, to portable devices able to provide portable access to auxiliary memory and auxiliary power.

Portable devices since their beginnings have come with a myriad of adaptors and transformers for the purpose of adding power to their onboard rechargeable batteries. There are numerous connectors and cables required, and differing voltages and currents supplied by the adaptors/transformers. As a result of competition, branding, etc., it is very unlikely that the consumer with multiple devices (PDA, cell phone, Camera, etc.) will have the means to transfer energy to more than one device from any single adaptor/transformer. In short, there is no "power standard" for portable devices, requiring the consumer to carry an array of adaptors/transformers to use with the devices.

Portable memory devices are well known. Commonly referred to as "memory sticks" or "thumb drives", portable memory devices typically comprise RAM memory in chip form mounted on a small PC board. Typically a USB connector provides a connection between the RAM and a host device such as a laptop computer, desktop computer, hand-held device, etc. In use, a user of such device will insert the device into a USB port of the host device and access is granted to and from the RAM. To determine the amount of available memory on the device, a user will typically perform a query using the host device which will display the amount of memory available, also displayed on the host device.

Similarly, host devices are known which can be utilized by a portable device as a source of auxiliary power when needed. For example, host devices exist having a USB port to which a cell phone, PDA, or other portable device can be connected to provide a limited amount of auxiliary power when needed for the portable device.

While the above-described portable devices function well, without plugging the portable devices into the host device, a user cannot tell how much available resources (available memory, available power, or both) are available for use. Accordingly, it would be desirable to have a portable memory and/or power device which can provide a user with access to auxiliary storage and/or auxiliary power, and which includes the capability of displaying to the user the available amount of the particular resource (memory and/or power) even when the device is disconnected from a host device in which it will be used.

SUMMARY OF THE INVENTION

The present invention comprises a portable power and/or memory device, which device includes integrated management circuitry enabling on-board management of energy storage, power management, and memory management. In a preferred embodiment, the device of the present invention can store and make available both memory and power, and provides an on-board means for displaying the various memory and/or power parameters associated with the device, thus providing both extra memory and extra power as needed.

BRIEF DESCRIPTION OF THE DRAWINGS

FIG. 1 is a block diagram illustrating the basic conceptual structure of a portable power/memory stick constructed in accordance with the present invention;

DETAILED DESCRIPTION OF THE PREFERRED EMBODIMENTS

FIG. 1 is a block diagram illustrating the basic conceptual structure of a portable power/memory stick 100 constructed in accordance with the present invention. A microcontroller core element 102 has attached thereto a flash memory 104, a display 106, and a USB connector 108. Flash memory 104 is coupled to microcontroller core 102 via mass storage interface 110, display 106 is coupled to microcontroller core 102 via display interface 112, and USB connector 108 is coupled to microcontroller core 102 via full speed USB transceiver 116 and full speed USB interface 114. A battery power management interface 128 couples a battery charger 118, a battery management and protection circuit 120, and a power management circuit 124 to microcontroller core 102. A battery 122 is coupled to battery management and protection circuit 120 and receives charging current from battery charger 118 and delivers battery power to microcontroller 102 (which can, in turn, provide the battery power to a host device via USB connector 108). In addition, a regulated +5 volt output connector 126 is coupled to power management circuit 124.

USB connector 108 provides connectivity between power/memory stick 100 and other portable devices, for exchanging data or transferring energy to them. Full speed USB interface 114 and full speed USB transceiver 116 provide and interface between microcontroller 102 and other portable devices for data communication. Mass storage interface 110 provides and interface between microcontroller core 102 and flash memory storage 104.

Display interface 112 provides an interface between microcontroller 102 and display 106. Display 106 is a display element that indicates memory space information and power information for power/memory stick 100.

Battery charger 118 controls the battery charging process and protects the battery under charge from overcharging. Battery management and protection circuit 120 provides a means for measuring battery voltage, current through the battery, battery or system temperature, and the energy level in the battery. It also provides means for protecting the battery from over-voltage, over-current, and over-temperature conditions.

Power management circuit 124 provides means for converting battery voltage to a required level needed to power the system and the +5 volt output. Regulated +5V output connector 126 provides an output connection for outputting +5V.

The basic operation and system concepts are described in more detail below.

The device of the present invention can be constructed in multiple configurations. These configurations include:

i) A combined power/memory stick/device;

ii) A power stick/device with visible indication of stored energy (referred to herein as a "fuel gauge");

iii) A memory stick/device with visible indication of available and/or used memory (referred to herein as a "capacity indicator");

iv) A combined power/memory stick device with fuel gauge and capacity indicator;

The power storage aspect of the invention can comprise an energy storage pack containing energy storage, energy storage management integrated circuitry, and power management integrated circuitry, such as input/output voltage regulation and current regulation.

The device may incorporate the system described in PCT Application No. US2004/019271, entitled "A Two-Stage Energy Storage Device" (Kular/Zhu), whereby the device is able to absorb additional energy on its own without attachment to a DC source.

The device illustrated in FIG. 1 is now described in further detail. As noted above, the device includes data storage (flash memory 104), energy storage (battery charger 118, battery management and protection controller 120, and power management controller 124), a controller (microcontroller core 102), a display (display 106) and the appropriate interfaces for USB protocol, mass storage, energy storage, energy storage management circuitry, power management circuitry and the display.

The data storage element(s) are capable of communicating with a host device in a well-known manner through the USB port to enable inputting/outputting of different kinds of data from/to the host device. This is accomplished via the controller and the full speed USB transceiver, full speed USB interface and mass storage interface.

This power storage element of the present invention includes a battery or other energy storage means. The energy storage means can be rechargeable and/or replaceable, and is capable of accumulating energy from either USB port of the host device or from other power sources, such as DC adaptors through a charger. The charger is capable of regulating input voltage and current to a proper voltage and current level for safely charging the energy storage means. Protection circuitry is included for protecting the energy storage means during charging or discharging. The protection circuitry monitors voltage, current, temperature and current accumulation of the energy storage for protecting it from over-voltage, over-current, and over-temperature, over-charged and over-discharged. The general concepts described above are well known and are performed using well-known means for accomplishing same. As noted above, the device can include a fuel gauge to monitor the energy level of the energy storage and display it to a user.

The power management circuitry regulates the voltage of the energy storage means to a proper level for outputting, charging or powering other portable devices, such as PDAs, cell phones, cameras and other portable devices. Both the energy storage management circuitry and the power management circuitry are interfaced to the controller so that information can be exchanged between them.

The controller is shared by the memory storage means and energy storage means. The controller can report information regarding both the memory storage means and the energy storage means to the host device and/or the display on the device itself. The display can display information about data and power stored by the device, such the how much free memory space is available and/or how much energy is remaining in the energy storage means, and can transfer this information to the host device so that it can be displayed on a screen of the host device.

The device is configured with firmware, which is the source code running on the controller. It can include the following modules:

i) Module for USB communication between controller and host computers or other devices. This module's functionality is for the power/memory stick 100 to exchange data with a host computer or other devices.

ii) Module for Mass storage to control the operation of storage to a storage device, such as flash memory 104.

iii) Module for Energy storage and power management. This module provides a second protection layer for energy storage; the first safety protection layer is provided by hardware. Specifically, a battery charge and discharge system should provide at least two layers of protection to protect the battery and the circuitry from failures due to over-voltage, over-current, over-temperature and the like. A protection circuit inside the battery pack provides a first protection layer. If an overage occurs, the protection circuit causes the battery pack to be disconnected from the input or output energy.

The second layer comprises the battery and power management circuits, e.g., the battery protection circuit and the battery charging control circuit. The third layer is the firmware protection module. The firmware reads the battery voltage, current, and temperature and compares them to maximum and minimum values for each, so that a determination can be made as to whether to terminate the charge or discharge process.

This module also communicates between the microcontroller 102 and the battery charger 118, battery management and protection circuit 120, and power management circuit 124.

iv) Module for display. This module is to drive the display (LCD or LED) 106 or send information to a host device for displaying on the device's screen.

A combined universal power/memory stick according to the present invention recognized certain issues resulting from the fact that portable devices are being provided with more and more functionality and features. A USB memory stick by itself can provide auxiliary space for data storage, but it cannot provide auxiliary power for the portable device when its batteries are depleted. A power stick by itself can provide auxiliary energy, but not auxiliary memory space for data storage. The combined USB power/memory stick of the present invention provided both in a single, small device.

A universal power stick in accord with the present invention, which is not available in the prior art, also fills a currently unfulfilled need of consumers of portable devices. Existing portable power devices are designed for a particular brand and/or type of portable device. In addition, different portable power devices use different input/output connectors and have different input and output operating parameters. Thus, there does not exist a portable power device that can be used to power or charge a variety of portable devices such as a cell phone, MP3 player, digital camera, and PDA. Further, existing portable power devices do not provide a "fuel gauge" display to display how much energy is left in the energy storage element of the portable power device.

Existing portable power devices use a cable and adaptor to supply power. In accordance with the present invention, the power stick can be plugged into a USB port of a PC or laptop to receive energy. This means that when the power stick is plugged into a USB port of a computer, the power stick is recharged so that, once unplugged, it is available to supply that power to another device. This eliminates the need for the previously mentioned cables and adaptors.

Most portable power devices are simply a charger or AC adaptor. A universal power stick in accordance with the present invention can provide sufficient power and energy to power portable devices when the portable device runs out of battery power. It is small, lightweight, and easy to carry.

Use of the USB connector gives access to the most popular connection between PC's and laptops and their peripherals, that is, a USB port. The USB port on a PC has 5V/500 mA output power available. More and more portable devices are adopting USB as their communication and energy charging port, and the power stick can obtain energy through this port quickly and easily. When a PC/laptop with a USB port is not available, an AC adapter with a USB output port can also be used to provide power to the power stick.

Although the present invention has been described with respect to a specific preferred embodiment thereof, various changes and modifications may be suggested to one skilled in the art and it is intended that the present invention encompass such changes and modifications as fall within the scope of the appended claims. For example, although an embodiment disclosed herein is illustrated as being in "stick" format, it is understood that larger and smaller configurations having the same functionality also fall within the scope of the present invention, as do "non-stick" configurations, such as memory/power stations or memory/power modules of any shape or size.

The invention claimed is:

1. A portable power/memory device, comprising:
a data-storage element;
a power-storage element having a rechargeable energy-storage;
a controller having a USB interface capable of communicating with an external power device, said data-storage element and said power-storage element being coupled to said controller; and,
a charging element capable of receiving charging power for delivery to and storage within said power-storage element via said USB interface, the charging element capable of regulating input voltage and current;
wherein the data-storage element, power-storage element, controller and charging element are self-contained;
wherein data can be stored to or conveyed from said data-storage element to external power devices communicating with said USB interface; and
wherein said power-storage element can provide power to external power devices.

2. The portable power/memory device of claim 1, wherein said charging element is further capable of receiving charging power via connection to a DC charge adapter.

3. The portable power/memory device of claim 1, wherein said portable power/memory device includes:
a display which displays a present level of energy available in said power-storage element.

4. The portable power/memory device of claim 1, wherein said portable power/memory device includes:
a display which displays a present level of memory available in said data-storage element.

5. The portable power/memory device of claim 1, wherein said portable power/memory device includes:
a display which displays a present level of memory used in said data-storage element.

6. The portable power/memory device of claim 1, wherein said portable device includes: a display which displays:
a present level of energy available in said power-storage element;
a present level of memory available in said data-storage element; and
a present level of memory used in said data-storage element.

7. The portable power/memory device of claim 2, wherein said controller is configured with firmware source code for controlling said charging, storage, and power-providing operations.

8. The portable power/memory device of claim 1, wherein said power-storage element provides power to external power devices via said USB interface.

9. The portable power/memory device of claim 1, further comprising an output connector, wherein said power-storage element provides power to external power devices via said output connector.

* * * * *